US010460045B2

(12) United States Patent
Chadwick et al.

(10) Patent No.: US 10,460,045 B2
(45) Date of Patent: *Oct. 29, 2019

(54) DRIFTING PARTICLE SIMULATOR FOR TRACKING CONTAMINATED SEDIMENT FROM STORMWATER DISCHARGE PLUMES

(71) Applicant: USA, as Represented by the Secretary of the Navy, San Diego, CA (US)

(72) Inventors: David Bartholomew Chadwick, San Diego, CA (US); Jonathon Keith Oiler, San Diego, CA (US); Matthew Joseph Nicholson, San Diego, CA (US)

(73) Assignee: United States of America as represented by Secretary of the Navy, Washington, DC (US)

( * ) Notice: Subject to any disclaimer, the term of this patent is extended or adjusted under 35 U.S.C. 154(b) by 979 days.

This patent is subject to a terminal disclaimer.

(21) Appl. No.: 14/624,705

(22) Filed: Feb. 18, 2015

(65) Prior Publication Data

US 2016/0239588 A1 Aug. 18, 2016

(51) Int. Cl.
*G01N 1/12* (2006.01)
*G06F 17/50* (2006.01)

(52) U.S. Cl.
CPC .............. *G06F 17/5009* (2013.01)

(58) Field of Classification Search
CPC ............ G06F 17/5009; Y02T 10/82
USPC .............................. 73/864, 864.51
See application file for complete search history.

(56) References Cited

U.S. PATENT DOCUMENTS 4,004,265 A * 1/1977 Woodruff ............. G01V 1/3843
367/130
4,557,697 A * 12/1985 Kontar ..................... B63B 22/06
114/326
9,404,906 B2 * 8/2016 Thomas ................. G01C 13/00

OTHER PUBLICATIONS

K.W. Lee, D.-H. Lee, U.-S. Jeong, J.Y. Yang, H.K. Jun, J.H. Park, "Implementation of embedded system for autonomous buoy," IEEE Oceans, pp. 1-4, 2011.

* cited by examiner

*Primary Examiner* — Nimeshkumar D Patel
*Assistant Examiner* — Nashmiya S Fayyaz
(74) *Attorney, Agent, or Firm* — Naval Information Warfare Center Pacific; Kyle Eppele; Susanna J. Torke

(57) ABSTRACT

A drifting particle simulator buoy system for a stormwater discharge plume which includes a GPS unit for tracking the buoy GPS location at the surface of the plume and a drogue/winch unit including a drogue chute and winch package which is lowered to the seafloor at a controlled descent rate which is comparable to the descent rate of certain size sediment particles of interest within the stormwater discharge plume. The drogue chute controls lateral drift with the underwater current at approximately the same velocity of the sediment particles of interest. A control unit controls the drogue/winch unit, including controlling the speed of the chute/winch unit to mimic the settling rate of the sediment particles of interest. A bottom detection sensor determines the GPS location where the chute/winch package reaches the seafloor and determining the depositional footprint of contamination at the determined GPS location.

18 Claims, 5 Drawing Sheets

DRIFTING PARTICLE SIMULATOR FOR TRACKING CONTAMINATED SEDIMENT FROM STORMWATER DISCHARGE PLUMES

FEDERALLY-SPONSORED RESEARCH AND DEVELOPMENT

This invention (Navy Case No. NC 103,250) is assigned to the United States Government and is available for licensing for commercial purposes. Licensing and technical inquiries may be directed to the Office of Research and Technical Applications, Space and Naval Warfare Systems Center, Pacific, Code 72120, San Diego, Calif., 92152; voice (619) 553-2778; email T2@spawar.navy.mil.

BACKGROUND

After rain events, the water discharged into coastal waters is known as stormwater. Stormwater discharges (an example is shown in FIG. 1), can carry with them a host of pollutants in the form of contaminated sediment. These events span coastal sites, including nearly every DoD coastal site, and are linked to all aspects of regulatory compliance including pollution discharge permitting, source control strategies, and environmental restoration programs which cost the Navy hundreds of millions of dollars annually.

The fact that these events do not occur as point sources make them extremely difficult to characterize and control. Sediment transport models often do not have enough resolution to resolve stormwater discharges and current field-based sampling strategies such as sampling near the outfalls only provides indirect evidence as to the transport, impact, and the ultimate fate of the contaminated sediment in the coastal waters.

SUMMARY

A drifting particle simulator buoy system for a stormwater discharge plume which includes a GPS unit for tracking the buoy GPS location at the surface of the plume and a drogue/winch unit including a drogue chute and winch package which is lowered to the seafloor at a controlled descent rate which is comparable to the descent rate of certain size sediment particles of interest within the stormwater discharge plume. The drogue chute controls lateral drift with the underwater current at approximately the same velocity of the sediment particles of interest. A control unit controls the drogue/winch unit, including controlling the speed of the chute/winch unit to mimic the settling rate of the sediment particles of interest. A bottom detection sensor determines the GPS location where the chute/winch package reaches the seafloor and determining the depositional footprint of contamination at the determined GPS location.

BRIEF DESCRIPTION OF THE DRAWINGS

Throughout the several views, like elements are referenced using like references, wherein.

DETAILED DESCRIPTION OF THE EMBODIMENTS

Figure 1:
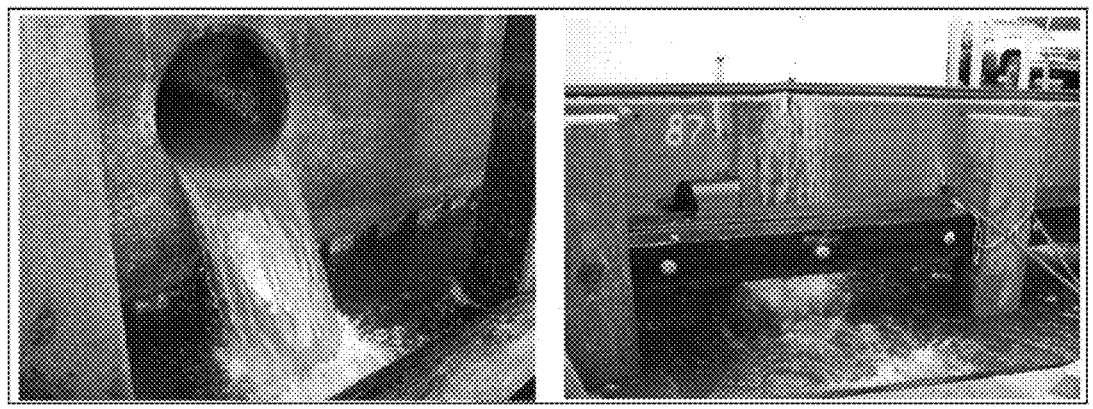
FIG. 1 shows storm drain and sheet flow discharges at Naval Base San Diego.
Figure 2:
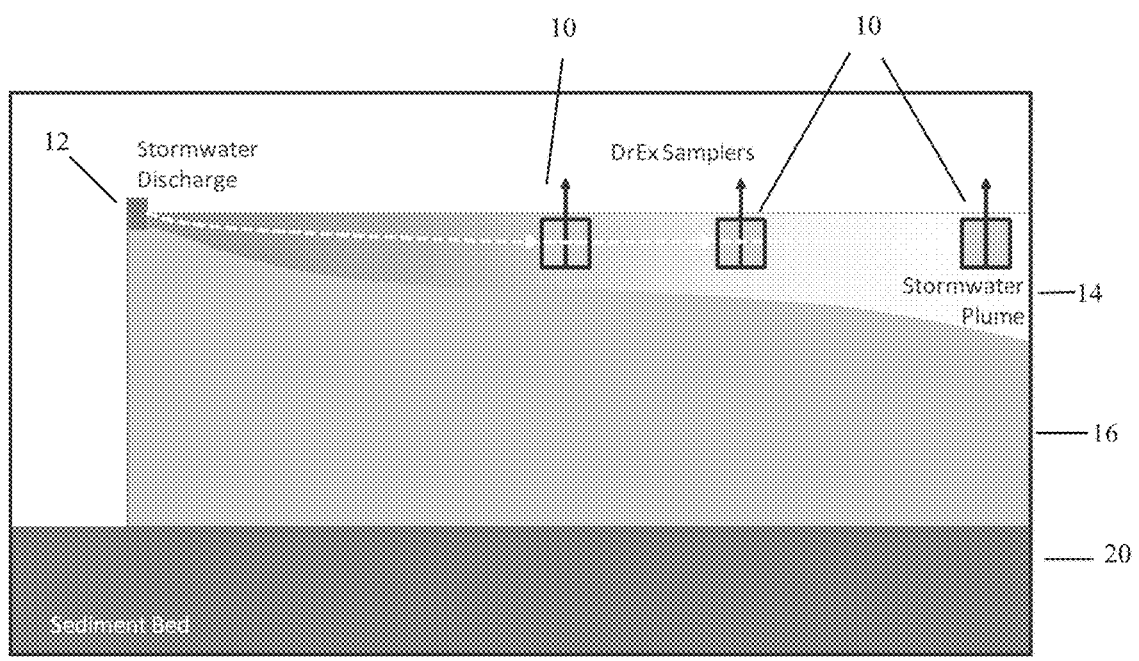
FIG. 2 shows a view of a drifting buoy sampler system.
Figure 3:
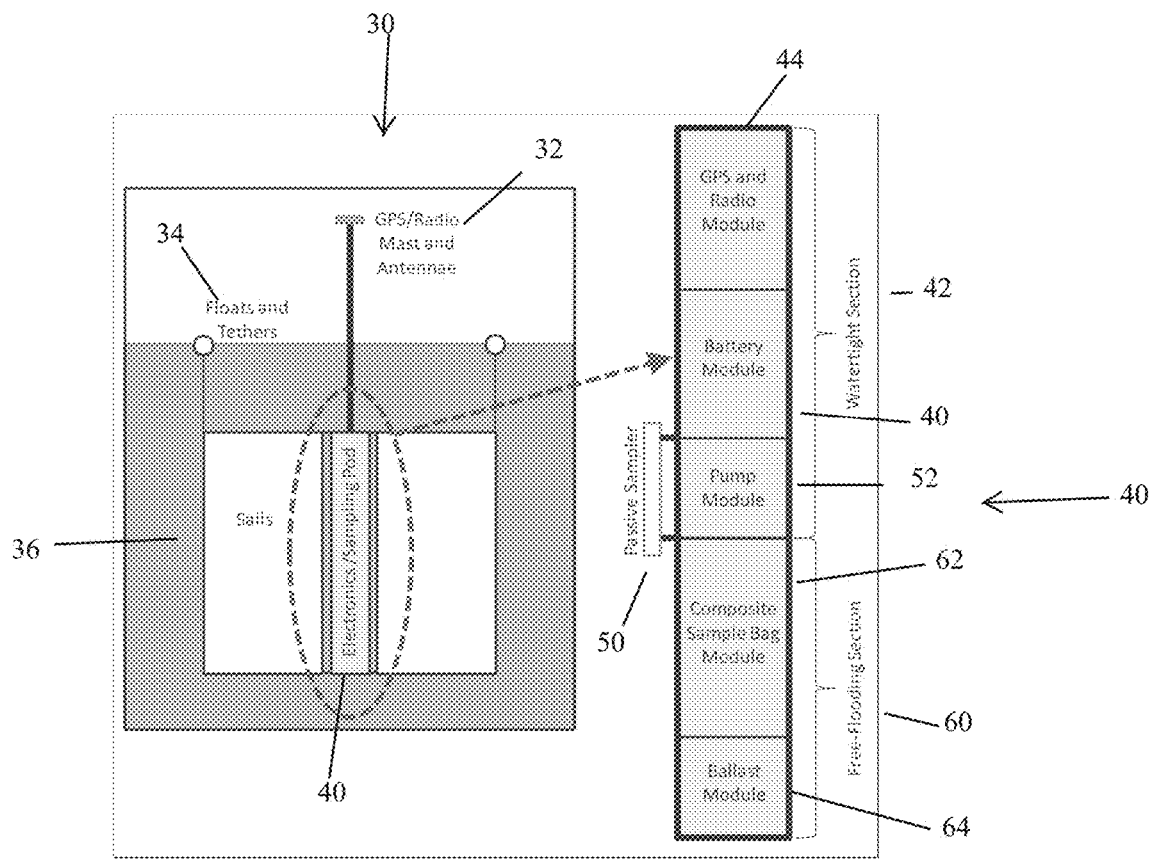
FIG. 3 is a schematic diagram showing a module designed for integrated and passive sampling of a stormwater plume.
Figure 4:
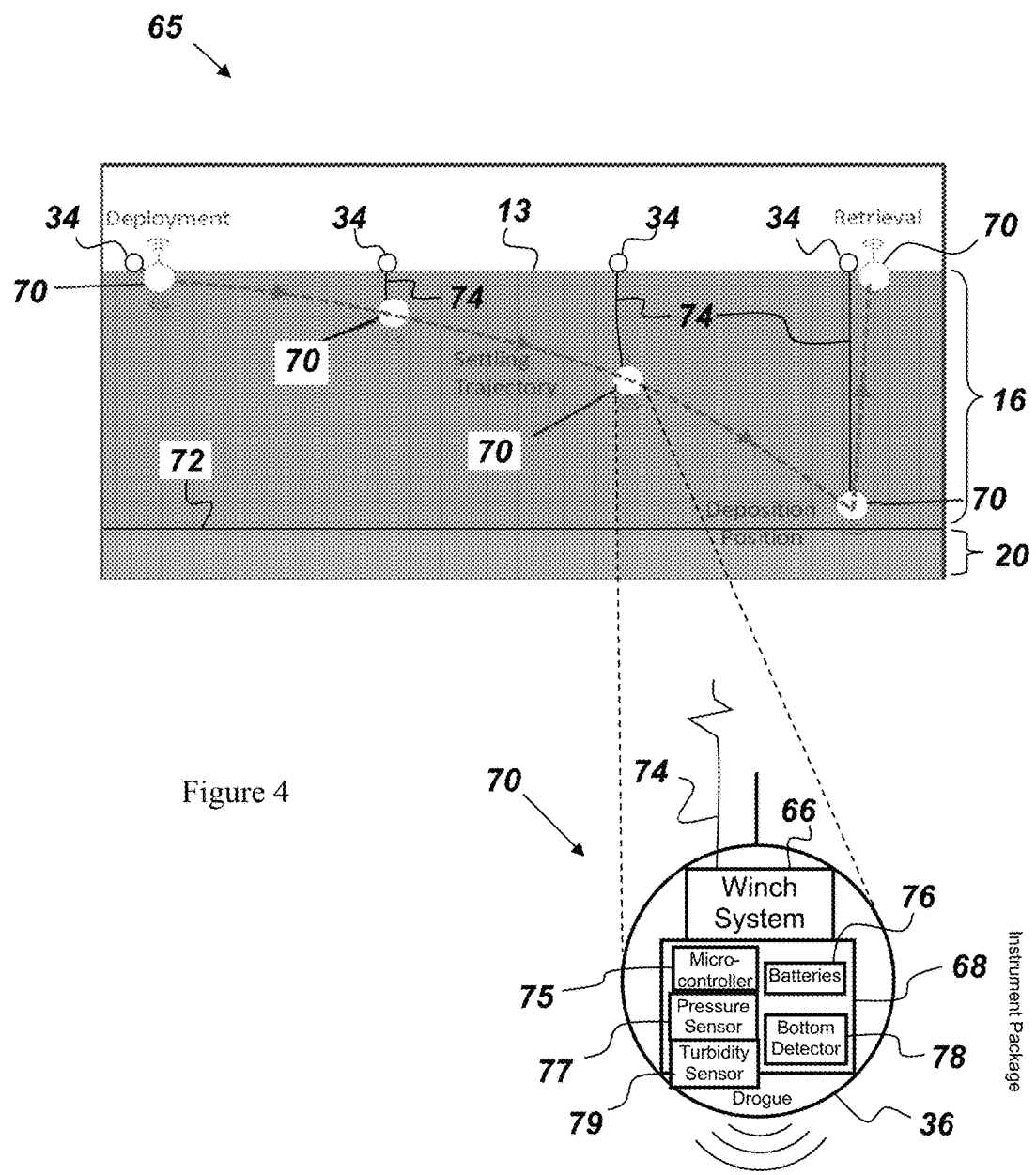
FIG. 4 is a schematic showing how a drogue chute and winch system mimics the settling trajectory of a particle-of-interest.
Figure 5:
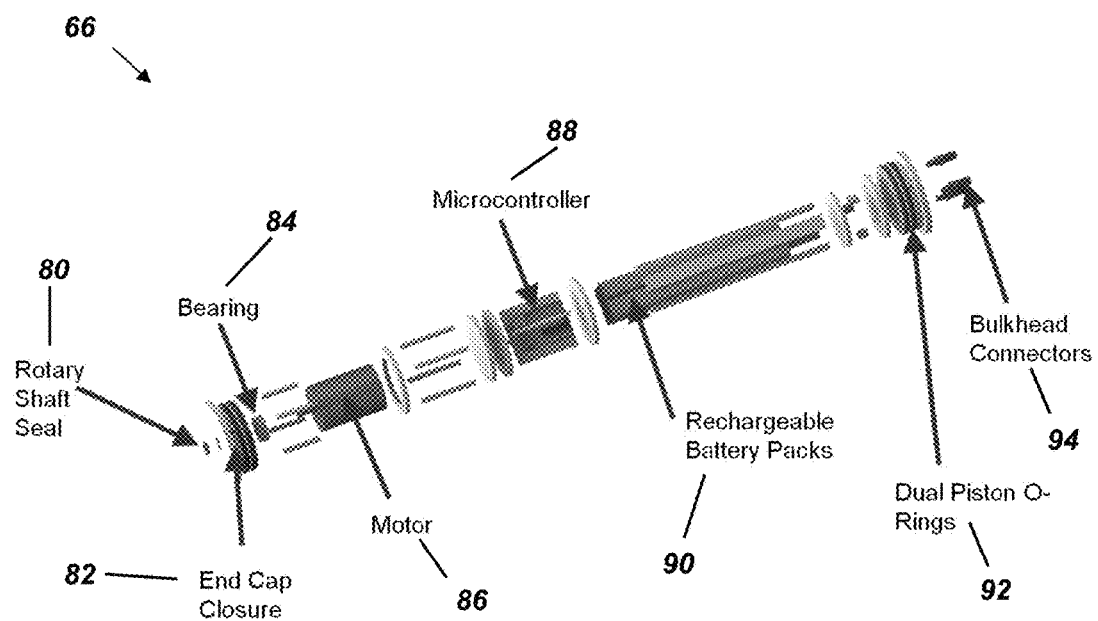
FIG. 5 is a CAD drawing showing the winch system which lowers itself and the drogue chute to the bottom of the seafloor.

Referring to FIGS. 2-3, one embodiment provides a capability to do both composite and passive sampling of the stormwater discharge plume as the plume moves from the source and disperses out in the coastal waters.

The buoy system collects integrated water samples within stormwater discharge plumes in coastal waters as the samples travel away from the source. The system provides the capability to pump seawater collected from the stormwater plume through a passive sampler, such as diffusive gradients in thin films or diffusive equilibrium in thin films and/or into a composite sampler for later laboratory measurements related to the identification and concentration of organic and metal contaminants after the buoy is retrieved.

The buoy system can be equipped with GPS so that the geo-position can be correlated with the types of time-weighted concentration of contaminants from specific sources. The buoy system can also equipped with communications to monitor and control the sampling.

The drifting buoy sampler system drifts with the stormwater plume which stays near the surface as it travels out to sea, as shown in FIG. 2.

One embodiment includes a GPS/communications unit, a pump and composite sampling bag, and a battery and microcontroller for setting the sampling rate. The battery and pump are not exposed to the seawater, while the composite sampling bag can be in a free-flooded chamber (see FIG. 3).

FIG. 3 is a schematic diagram showing the key module designed for integrated and passive sampling of the stormwater plume.

During this time, the buoy system collects composite and passive samples of the seawater and its contents. While collecting an integrated sample, the GPS position of the buoy will be recorded. The combined data provides insight into how specific contaminants disperse from the plume as they are dispersed out into the seawater.

Referring again to FIG. 2, the drifting sampler buoy system 10 drifts with a stormwater plume 14. The plume 14 is shown above the sea water 16 and sediment bed 20 in FIG. 2. As shown in FIG. 2, the buoy system 10 stays near the surface as the buoy system 10 travels out to sea, along with the stormwater plume 14.

FIG. 3 shows a schematic diagram of a module 30 designed for integrated and passive sampling of a stormwater plume. The module 30 includes a GPS/radio mast and antenna 32, floats/tethers 34, sails 36, and electronics/sampling pod 40.

The pod 40, shown in more expanded form in the right side of FIG. 3, includes a watertight section 42, including GPS/radio module 44, battery module 46, passive sampler 50, and pump module 52.

The pod 40 also includes a free flooding section 60, which includes composite sample bag module 62 and ballast module 64.

The system collects an integrated sample of seawater content during the entire period the plume travels out to sea, not just at the source of the plume where the contaminants will be strongest. The system comprises integrating a composite and passive sampling mechanism with the buoy. Because the drifter automatically follows the plume, the entire sampling event can be done autonomously with no operator intervention except to deploy and retrieve the system.

The system allows for linking the sampling time to exposure durations for organisms. For example many toxicity tests are associated with 48-96 hour exposure times. Thus a composite sample collected over that time period would provide a realistic estimate of the concentration that an organism (like a planktonic larvae) that was drifting with the plume would be exposed to.

Many samplers can be released in groups or over time to provide more detailed descriptions and statistical information about the dispersion, concentrations and exposure levels in these plumes. An interface of the sampler and sensors to the user via satellite, cell phone, radio, Bluetooth or WiFi will allow for both monitoring of the sampling process and control of the sampler remotely.

Alternatively, one could bring along multiple composite sampling bags and fill the bags at different periods of time as the buoy drifts away from the source, thereby giving an indication of how the concentrations of contaminants change with distance from the source. The sampling could also be linked to the feedback from various sensors. For instance with feedback from the GPS it could be constrained to sampling in certain spatial areas. With feedback from a salinity sensor, it could be constrained to only sampling while it was in the freshwater storm plume. With feedback from a turbidity sensor it could be linked to sampling when the particle concentrations were in a certain range. The composite sampler could also be replaced by a sorption type column sampler filled with reactive material so that it pre-concentrated certain contaminants of interest.

The system could also utilize passive samplers such as Polyethylene Sampling Devices that can simply be attached to the drifter and equilibrate with the water contaminants over time.

Referring now to FIGS. 4-5, an embodiment 65 of a buoy-system can mimic the transport and deposition of specific sizes of contaminated sediment particles as they travel from the source and eventually settle on the seafloor 72. A controllable-descent rate underwater winch system 66 lowers an instrument package 68 and drogue chute 36 to the seafloor 72. The combination of the winch system 66, instrument package 68, and drogue chute 36 is represented in FIG. 4 by reference character 70. In addition, the embodiment 65 of the buoy system is equipped with communications to monitor and control the descent rate and detect when it reaches the seafloor 72.

The embodiment 65 of the buoy system uses GPS which tracks the buoy location of the surface float 34 at the surface 13 of the water. Underneath the surface float 34 is a drogue winch system/instrument package 70 which can be lowered to the seafloor 72 at a controlled descent rate (e.g., between 0.1-10 mm/s)—a range that covers a wide swath of various size sediment particles.

Lowering the drogue/winch system/instrument package 70 ensures that the embodiment 65 of the buoy system drifts laterally with the underwater current at the same velocity as the particles of interest (FIG. 4). The speed at which the drogue/winch system/instrument package 70 is lowered can be controlled to mimic the settling rate of the sediment particle of a particular size with use of a pressure sensor. FIG. 4 shows the settling of the drogue/winch system/instrument package 70 from deployment in a settling trajectory to the deposition position, and finally at the retrieval of the drogue/winch system/instrument package 70.

By using bottom-detection sensors 78, we can pinpoint precisely the GPS location where the controlled-descent drogue/winch/instrument package 70 reaches the seafloor 72. Using embodiment 65 of the buoy system, we can determine the depositional footprint of contamination on the seafloor 72 to target for future analysis (impact and fate) and potential cleanup.

FIG. 4 shows an expanded view of components of the winch system 66. The winch system 66 was designed as a motor-controlled winch mounted within the drogue 36 (to minimize drag effects) that releases a slack line 74 (such as a fishing wire) to provide slack to the negatively buoyant drogue chute 36 and winch system 66. The winch system 66 is mounted on an instrument package 68 that contains a microcontroller 75, batteries 76, along with a pressure sensor 77 and bottom detection sensor 78 to carefully control the descent rate and mark the time when the system reaches the seafloor. Instrument package 68 can also contain a turbidity sensor 79 to measure how particle concentrations change as a function of distance and depth. This time is matched to the GPS-time monitored at the surface float 34 and the coordinates are used to mark the location where the contaminated particles have likely been deposited.

FIG. 5 is a CAD drawing showing the winch system 66 which lowers itself and the drogue chute 36 to the bottom of the seafloor 72 (see FIG. 4). The winch system 66 in FIG. 5 includes rotary shaft seal 80; end cap closure 82; bearing 84; motor 86; microcontroller 88; rechargeable battery packs 90; dual piston O-rings 92; and bulkhead connectors 94. Depth and bottom detection sensors (not shown in FIG. 5) can be attached to the winch system 66. The vertical depth of drogue/winch unit 500 can be determined by using a pressure sensor. The winch cable can act as a telemetry cable to allow real-time transmission of data to the buoy.

This system tracks the three-dimensional trajectories of sediment originating from a stormwater discharge plume to its final depositional location on the seafloor 72. The winch system 66 and instrument package 68 can be mounted within the drogue 36. The drogue/winch system/instrument package 70 can be lowered to the seafloor 72 at a controllable descent rate without operator intervention. The locations where the particles are deposited provide the capability of future sediment-contaminant analyses of these areas which can provide more information about whether a clean-up is necessary. In addition, any potential cleanups might have lower costs associated with a better understanding of the contaminant footprint and more success by cleaning only areas that require it. The buoy system can include satellite, cellular or radio-based telemetry of the three-dimensional position and sensor data from the buoy.

Buoyancy engines could be one possible alternative to lowering the drogue 36 and instrument package 68 with the underwater winch system 66. However, controlling the very slow descent rate could be difficult. In addition, the buoyancy engine would need to resurface to determine its location and the lag-time associated with resurfacing and reacquiring GPS could negate this systems usefulness.

A composite or passive water sampling system could provide the capability to sample the sediment as it traverses the water column to determine how the contaminant species change with distance and depth from the source. Additional turbidity sensors could be used to measure how particles concentrations change as a function of distance and depth.

Additionally, the system could provide the capability of measuring conductivity or temperature, for example, and water sampling as well as particle sampling.

From the above description, it is apparent that various techniques may be used for implementing the concepts of the present invention without departing from its scope. The described embodiments are to be considered in all respects as illustrative and not restrictive. It should also be understood that system is not limited to the particular embodiments described herein, but is capable of many embodiments without departing from the scope of the claims.

What is claimed is:

1. A drifting particle simulator buoy system having a GPS location for a stormwater discharge plume comprising:
    a GPS unit for tracking the buoy system having a GPS location at the surface of the plume;
    a drogue/winch unit including a drogue chute and winch package which is lowered to the seafloor at a controlled descent rate which is comparable to the descent rate of certain size sediment particles of interest within the stormwater discharge plume;
    the drogue chute controlling lateral drift with the underwater current at approximately a same descent rate of the sediment particles of interest;
    a control unit for controlling the drogue/winch unit, including controlling the speed of the drogue/winch unit to mimic a settling rate of the sediment particles of interest; and
    a bottom detection sensor for determining the GPS location where the drogue/winch package reaches the seafloor and determining a depositional footprint of contamination at the determined GPS location.

2. The buoy system of claim 1 where the control unit includes a microcontroller, a rechargeable battery pack and a motor for controlling the drogue/winch unit.

3. The buoy system of claim 2 where the drogue chute is lowered to the seafloor at a controlled descent rate without operator intervention.

4. The buoy system of claim 3 including tracking three dimensional trajectories of sediment originating from the stormwater discharge plume to a final depositional location on the seafloor.

5. The buoy system of claim 4 including a pressure sensor for determining a vertical depth of the drogue/winch unit.

6. The buoy system of claim 5 wherein the control unit provides sediment contaminant analyses.

7. The buoy system of claim 5 wherein the control unit provides water sampling analyses.

8. The buoy system of claim 5 wherein the control unit provides conductivity analyses.

9. The buoy system of claim 5 wherein the control unit provides temperature analyses.

10. The buoy system of claim 5 where the descent rate of the buoy system is approximately 0.1-10 mm/s.

11. The buoy system of claim 10 where the control unit samples the sediment as the sediment traverses one or more water columns.

12. The buoy system of claim 11 in which the winch includes a cable to act as a telemetry cable for real-time transmission of data.

13. The buoy system of claim 12 including satellite, cellular or radio based telemetry of a three dimensional position and sensor data.

14. The buoy system of claim 13 including a buoyancy engine for lowering the buoy system.

15. The buoy system of claim 14 wherein the system is negatively buoyant and includes a slack line to provide slack to the buoy system.

16. A drifting particle simulator buoy system having a GPS location for a stormwater discharge plume comprising:
    a GPS unit for tracking the GPS location at the surface of the plume;
    a drogue/winch unit including a drogue chute and winch package which is lowered to the seafloor at a controlled descent rate which is comparable to the descent rate of certain size sediment particles of interest within the stormwater discharge plume;
    the drogue chute controlling lateral drift with the underwater current at approximately a same descent rate of the sediment particles of interest;
    a control unit for controlling a drogue/winch unit, including controlling the speed of the drogue/winch unit to mimic a settling rate of the sediment particles of interest;
    a bottom detection sensor for determining the GPS location where the drogue/winch package reaches the seafloor and determines a depositional footprint of contamination at the determined GPS location;
    the control unit tracking three dimensional trajectories of sediment originating from the stormwater discharge plume to a final depositional location on the seafloor.

17. The buoy system of claim 16 where the control unit samples the sediment as the sediment traverses one or more water columns.

18. The buoy system of claim 17 in which the winch includes a cable to act as a telemetry cable for real-time transmission of data.

* * * * *